United States Patent [19]
Wanlass

[11] Patent Number: 5,079,439
[45] Date of Patent: Jan. 7, 1992

[54] NOISE REJECTING TTL TO CMOS INPUT BUFFER

[75] Inventor: Frank Wanlass, Cupertino, Calif.

[73] Assignee: Standard Microsystems Corporation, Hauppauge, N.Y.

[21] Appl. No.: 655,178

[22] Filed: Feb. 12, 1991

Related U.S. Application Data

[63] Continuation of Ser. No. 375,209, Jun. 30, 1989, abandoned.

[51] Int. Cl.⁵ .................... A03K 19/12; A03K 19/092
[52] U.S. Cl. ........................ 307/246; 307/451; 307/475; 307/264; 307/443
[58] Field of Search ............... 307/443, 448, 451, 475, 307/246, 264

[56] References Cited

U.S. PATENT DOCUMENTS

| | | | |
|---|---|---|---|
| 4,563,594 | 1/1986 | Koyama | 307/290 |
| 4,763,023 | 8/1988 | Spence | 307/481 |
| 4,786,830 | 11/1988 | Foss | 307/475 |
| 4,812,687 | 3/1989 | Larson et al. | 307/290 |
| 4,890,010 | 12/1989 | Neudeck et al. | 307/475 |
| 4,933,648 | 6/1990 | Frogge | 307/475 |
| 4,939,394 | 7/1990 | Hashimoto | 307/290 |

Primary Examiner—Stanley D. Miller
Assistant Examiner—Margaret Rose Wambach
Attorney, Agent, or Firm—Hopgood Calimafde Kalil Blaustein & Judlowe

[57] ABSTRACT

A TTL to CMOS buffer circuit includes a relatively high-speed first inverter path and a second relatively low-speed inverter path connected to the first path and effective to control the operation of the first path inverter so that short-duration positive- or negative-going noise pulses of amplitude up to 2.4 volts do not incorrectly affect the output level.

30 Claims, 1 Drawing Sheet

AC TRANSFER CURVE

DC TRANSFER CURVE

NOISE REJECTING TTL TO CMOS INPUT BUFFER

This application is a continuation of application Ser. No. 375,209, filed June 30, 1989, now abandoned.

BACKGROUND OF THE INVENTION

The present invention relates generally to input buffer circuits, and more particularly to an input buffer for converting low-level signals to higher-level signals.

In many modern semiconductor integrated circuits, there is a need to convert a low-level logic input signal to an output logic signal at a higher level. For example, it is often a requirement to convert a TTL input signal, which typically varies between 0 and 3.0 volts for a logic "0" and logic "1", to a higher-level CMOS swing which varies between 0 and 5 volts. In order for TTL circuits to be able to function with CMOS circuits, an interface or buffer must be provided between the two circuits to convert the relatively low TTL logic levels to higher levels at which CMOS circuits can reliably operate.

One relatively simple TTL to CMOS buffer is a CMOS inverter which receives a TTL-level input and provides a CMOS-level output. This TTL-CMOS inverter buffer includes an NMOS transistor, which is about five times wider than the PMOS transistor, in contrast to being half as wide as the PMOS transistor as is conventional in a typical CMOS inverter. Therefore, assuming a +5 volt supply, this CMOS inverter will typically switch its output through the entire CMOS range of 5 volts when its input passes through about 1.5 volts, rather than about 2.5 volts, the switching point in a normal CMOS inverter. More complex buffer circuits that perform this function are also known, as exemplified by the circuits described in U.S. Pat. Nos. 3,755,690 and 4,048,518.

A switching point of 1.5 volts for this inverter is suitable for operation with a TTL input, because the TTL convention is that a voltage level of 2.0 volts or greater is considered a logic "1" and a voltage level of 0.8 volts or less is considered a logic "0". However, these TTL 0.8 volt and 2.0 volt limits are a d.c. specification. TTL is normally operated under a.c. conditions with a swing of 0 to 3 volts, which places the 1.5 volts switching point of the simple buffer in the middle of the input TTL signal range.

If the input buffer has a switching point of 1.5 volts, and if the input is normally varying between 0 volts and 3 volts, the buffer is said to have a noise margin of about 1.5 volts on both sides of the switching point. That is, if the input is supposed to be at 0 volts, then almost up to a positive-going 1.5 volt short-duration noise pulse can be tolerated; thus, no error is introduced in the buffer output level if a noise pulse of this level appears at the input. Similarly, if the input is supposed to be at 3.0 volts, then a negative-going 1.5 volt noise pulse of only about 1.5 volts can be tolerated in this buffer. Therefore, both positive and negative-going pulses greater than 1.5 volts cannot be tolerated in this known input buffer, so that noise pulses at these levels cause an incorrect CMOS level to be produced in response to one or both of the TTL input levels.

It is an object of the present invention to provide an improved TTL to CMOS buffer with a higher noise margin, that is, one which can tolerate higher-level noise pulses.

The buffer of the invention is able to tolerate positive-going noise pulses of about 2.4 volts superimposed on an input of 0 volts, and can tolerate negative-going noise pulses of about 1.8 volts superimposed on an input of 3.0 volts. The buffer of the present invention satisfies the TTL d.c. specification of 0.8 volts for a logic "0" and 2.0 volts for a logic "1" The buffer of the invention meets these apparently contradictory goals by taking advantage of the fact that input noise is typically of short duration (a few nanoseconds to a few tens of nanoseconds), whereas the TTL d.c. specification input voltages are of a much longer duration.

The input buffer circuit of the present invention includes two separate paths between its input and output. The first is a high-speed a.c. path, which switches between the "0" and "1" logic states at a high switching voltage of about 2.5 volts on a rising 0 to 3 volt input signal, and switches between the "1" and "0" logic states at a low switching voltage of about 1.1 volts on a falling 3 to 0 volt input signal. The second path, which controls the operation of the first path, is a slower speed d.c. path, having a low switching voltage of about 1.1 volts, for both rising and falling input signals. By providing different a.c. and d.c. switching voltages, and by creating an hysteresis effect for the a.c. path the TTL to CMOS buffer of the invention is better able than conventional buffers to reject high-frequency input noise spikes.

To the accomplishment of the above and to such further objects as may hereinafter appear, the present invention relates to an improved TTL to CMOS input buffer, substantially as defined in the appended claims and as described in the following specification taken together with the accompanying drawings in which:

DETAILED DESCRIPTION OF THE INVENTION

Figure 1:
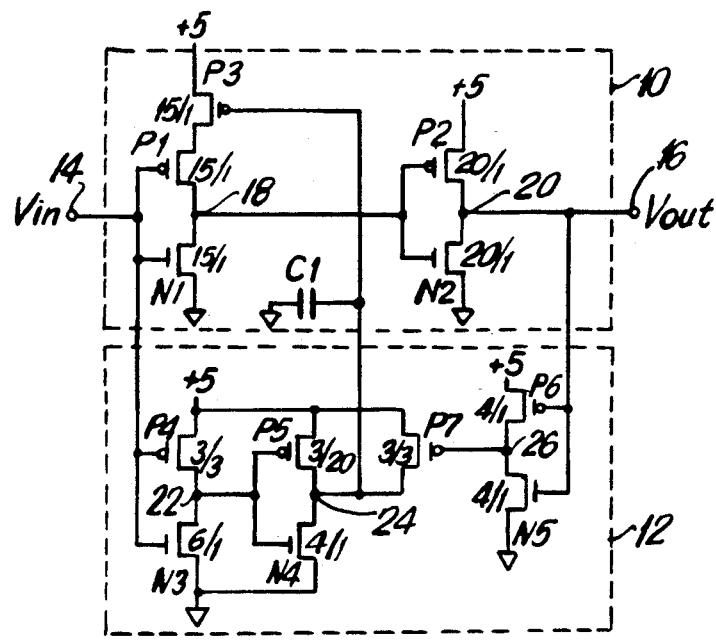
FIG. 1 is a schematic diagram of a TTL to CMOS input buffer according to an embodiment of the present invention.

Broadly considered, the TTL to CMOS buffer of the invention, as exemplified by the embodiment thereof illustrated schematically in FIG. 1, includes a first high-speed or a.c. path 10, and a second, slower-speed or d.c. path 12. Paths 10 and 12 are both connected between an input node 14, which receives an input TTL level signal Vin, and an output node 16, at which a CMOS-level output signal Vout is obtained.

The first path 10 includes an input inverter that includes PMOS transistors P3 and P1 and an NMOS transistor N1 connected in series between a supply voltage, here shown as +5 volts, and a reference potential, here shown as ground. The larger the W/L ratio of a transistor the more drain current it can pass for the same gate voltage. The preferable width-to-length (W/L) ratios in microns are given in FIG. 1 for each of these MOS transistors as well as for all other MOS transistors included in the buffer circuit o FIG. 1. It is, however, to be understood that these dimensional ratios are given solely as representative and are not intended to be limiting in scope or effect. For example, these ratios would change for different electrical process parameters.

The W/L ratios for the inverter consisting of transistors N1, P1 and P3 are selected so that its Vin switching voltage is about 2.5 volts if the gate of transistor P3 is at 0 volts. The gates of transistors P1 and N1 are connected to the Vin input node 14, and an inverter node 18 is established at their common drain connection. Node 18 is connected to the gates of transistors P2 and N2, which are connected between the +5 volt supply and ground. Transistors P2 and N2 form a second inverter stage. An inverter node 20 at the common drain connection of transistors P2 and N2 is connected to the output Vout node 16.

The slower-speed d.c. path 12 includes an input inverter stage consisting of transistors P4 and N3 connected between the +5 volts supply and ground. The W/L ratios for the N3, P4 inverter are less than that of the P1, N1 inverter and are selected to establish a switching point or the N3, P4 inverter at a Vin of about 1.1 volts. The gates of transistors P4 and N3 are connected to Vin node 14 and an inverter node 22 is formed at their common drain connection. Node 22 is connected to the gates of transistors P5 and N4, which are connected between the +5 supply and ground. The inverter output node 24 at the common drain connection of transistors N4 and P5 is connected to the gate of transistors P3, and to, one side of a capacitor C1, the other side of which is connected to ground. C1 represents stray capacitance plus the capacitance looking into transistor P3, and may be typically in the order of 0.1 pf.

Also included in the slower-speed path 12 is a second inverter consisting of transistors P6 and N5 connected between the +5 volt supply and ground. The gates of transistors P6 and N5 are connected to the output Vout node 16. An output inverter node 26 at the common drain connection of transistors N5 and P6 is connected to the gate of transistor P7. The source of transistor P7 is connected to +5 volts and its drain is connected to the output node 24 of the inverter stage made up of transistors P5 and N4, as well as to capacitor C1 and the gate of transistor P3.

Figure 2:
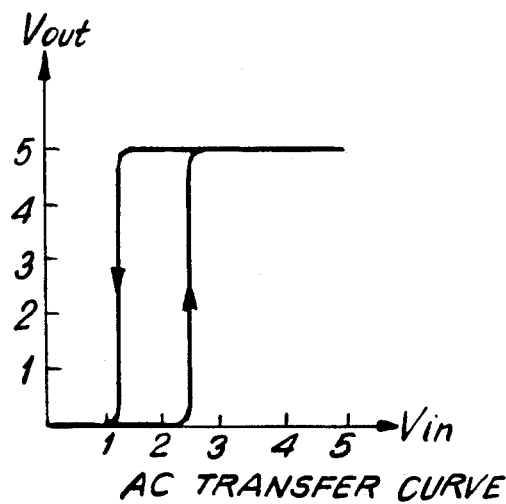
FIG. 2 is a Vin to Vout a.c. transfer curve of the input buffer of the invention.
Figure 3:
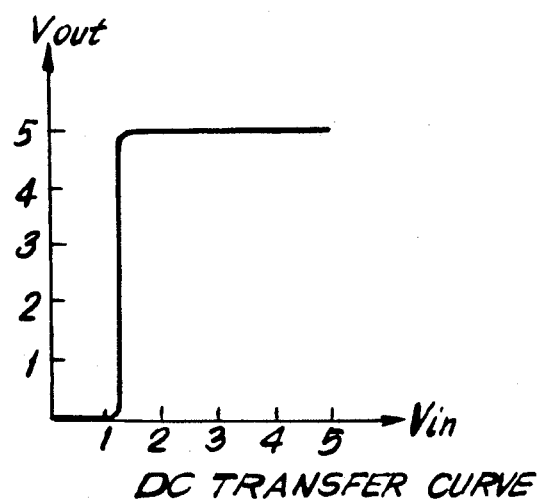
FIG. 3 is a Vin to Vout d.c. transfer curve of the input buffer of the invention.

The operation of the buffer circuit of FIG. 1 can now be described with additional reference to the a.c. and d.c. transfer curves of the high-speed and low-speed paths 10 and 12, respectively illustrated in FIGS. 2 and 3. There are four cases that are considered: 1) Vin is pulsed from 0 volts to 3.0 volts and back to 0 volts to represent a real signal; 2) Vin is pulsed from 0 volts to 2.4 volts and back to 0 volts to represent positive-going noise; 3) Vin is pulsed from 3.0 volts to 1.2 volts and back to 3.0 volts to represent negative-going noise; and 4) Vin is switched between 0.8 and 2.0 volts for d.c. conditions.

For case 1), if Vin goes from 0 to 3.0 volts, nodes 18 and 22 will immediately go low, because the 3.0 volts input is greater than the switching points of both inverters and is thus sufficiently high to switch both the N1, P1, P3 inverter and the N3, P4 inverter. A low level at node 18 causes nodes 20 and Vout to go high, which switches the P6, N5 inverter and causes node 26 to go low. A low level at node 22 turns off transistor N4, and a low level at node 26 turns on transistor P7. When transistor P7 is thus turned on, node 24 immediately goes to +5 volts, which turns off transistor P3. When Vin then goes back to 0 volts, transistor P4 turns on and node 22 goes high, but since transistor P3 is off, node 18 remains low even though transistor P1 is on. The high level at node 24 causes transistor N4 to turn on to cause capacitor C1 to charge low rapidly so that node 24 goes low because transistor N4, as a result of its greater W/L ratio, compared to that of transistor P7 overcomes transistor P7 that is then also on. Once node 24 is low, transistor P3 is turned on, and since transistor P1 is on, node 18 goes high. The level at node 18 is inverted in the P2, N2 inverter and Vout goes low, and node 26 goes high, turning off transistor P7.

For case 2), if Vin goes from 0 to 2.4 volts, the input voltage is not sufficiently high to immediately switch node 18 low, but node 22 of the P4, N3 inverter immediately switches low, because its switching point is only about 1.1 volts. A low level at node 22 causes transistor N4 to turn off and transistor P5 to turn on. Transistor P5 is relatively long and narrow so that, even though it is on, it is a weak current source and will only slowly charge capacitor C1 and thus node 24 positive.

If Vin is at 2.4 volts for only a few nanoseconds before returning to 0 volts, as would be typical for a noise pulse, then node 24 does not rise very far positive before it is pulled back to ground by transistor N4 turning on. If node 18 does not go low, then Vout, which is the output of inverter N2, P2, will not go high. If Vin were at 2.4 volts for a long time, which is not the case for a noise pulse, the gate of transistor P3 would eventually turn off and an input level of 2.4 volts would be enough to switch node 18 low and Vout high.

In case 3), if Vin is at 3.0 volts that means the gate of transistor P3 is at 5.0 volts and transistor P3 is off. If Vin then drops to 1.2 volts, transistor P1 will turn on, but since transistor P3 is off and in series with transistor P1, node 18 will not go high, and Vout will remain high. If Vin drops only to 1.2 volts, it will not be sufficiently low to switch node 22 high, which would be required to switch node 24 low and turn on transistor P3. For this case of a negative-going pulse, even a long-duration noise signal will not switch Vout low unless the input pulse drops below 1.1 volts.

For the d.c. case 4), the N3, P4 inverter controls the situation. For a Vin less than 0.8 volts, node 22 is high, node 24 is low, transistor P3 is on, transistor P1 is on, node 18 is high, and Vout is low. For a level of Vin greater than 2.0 volts, transistor N1 is on, transistor P1 is partially on, node 22 is low, node 24 is high (after enough time), transistor P3 is off, node 18 is low, and node 20 and Vout are high.

The input buffer of the invention, besides being effective in reducing the effect of noise on Vin, will also suppress ground noise. The ground returns shown in FIG. 1 are idealized. Typically, a high speed chip, due to inductance, will have ground returns that are noisy and not exactly at zero volts. For example, a positive going ground noise pulse in the buffer circuit of FIG. 1 would be equivalent to a negative-going noise pulse on Vin. If Vin is to be a logic "1" at 3.0 volts, the circuit can withstand a positive ground noise of up to 1.8 volts before it incorrectly switches. Likewise, if Vin is a logic "0" of 0 volts, a negative-going ground noise of up to 2.4 volts will still not cause incorrect logic operation.

It will thus be understood that the TTL to CMOS input buffer of the invention effectively prevents incorrect logic switching that would be caused by noise signals of up to 2.4 volts. It should also be understood that modifications may be made in the embodiment of the invention herein specifically described without necessarily departing from the spirit and scope of the invention.

What is claimed is:

1. A buffer comprising an input and an output; a first, relatively high-speed circuit coupled between said input and said output and including a first switching element having a first switching voltage; a second, relatively low-speed circuit coupled between said input and said output and to said first circuit, said second circuit including a second switching element having a second switching voltage lower than said first switching voltage and means for controlling the operation of said first switching element in said first circuit, said first circuit including a first inverter having an input coupled to said buffer input and including said first switching element, said second circuit including means connected to said first switching element for controlling the operation thereof, thereby to prevent operation of said first inverter in response to a short-duration noise signal at said input.

2. The buffer of claim 1, in which said controlling means includes means connected intermediate said switching element and said second circuit, the latter further including means for establishing a control voltage at said controlling means at one or two voltage levels.

3. The buffer of claim 2, in which said first inverter includes first and second transistors having their output paths connected in series and their gates connected to said input, said first switching element having an output path connected between a supply voltage and the output path of said first and second transistors.

4. The buffer of claim 2, in which said controlling means includes charging means and said voltage establishing means includes means for supplying current to said charging means to charge said charging means to one of said voltage levels at a first fast rate and to charge said charging means to a second voltage level at a second slow rate.

5. The buffer of claim 4, in which said current supplying means includes a first transistor effective when conducting to charge said charging means to said one of said voltages at said first rate, and a second transistor effective when conducting to charge said charging means to a second voltage at said second rate.

6. The buffer of claim 5, in which said second transistor has a higher W/L ratio than that of said first transistor.

7. The buffer of claim 6, in which the output paths of said first and second transistors are connected between a voltage source and a reference potential, an inverter output node being established at the connection of said output paths said inverter output node being connected to said charging means.

8. The buffer of claim 1, in which said second circuit includes a third inverter having an input coupled to said buffer input, said first inverter including first and second transistors, said third inverter including third and fourth transistors, said first and second transistors having higher W/L ratios than said third and fourth transistors, whereby said first inverter has a higher switching point than said third inverter.

9. The buffer of claim 8, further comprising a fourth inverter having an input coupled to the output of said third inverter and an output coupled to said switching element.

10. The buffer of claim 9, further comprising a fifth inverter having an input coupled to the output of said second inverter, and a fifth transistor having an output path connected between a voltage source and the output of said fourth inverter and a control gate coupled to the output of said fifth inverter.

11. The buffer of claim 1, in which "a" current providing means includes a first transistor effective when conducting to charge "a" charging means to a first voltage at a first relatively slow rate, and a second transistor effective when conducting to charge said charging means to a second voltage at a second faster rate.

12. The buffer of claim 11, in which said second transistor has a higher W/L ratio than that of said first transistor.

13. The buffer of claim 12, in which the output paths of said first and second transistors are connected in series between a voltage source and a reference potential, an output node being established at their common output connection.

14. A buffer comprising an input and an output; a first, relatively high-speed circuit coupled between said input and said output and including a first switching element having a first switching voltage; a second, relatively low-speed circuit coupled between said input and said output and to said first circuit, said second circuit including a second switching element having a second switching voltage lower than said first switching voltage and means for controlling the operation of said switching element in said first circuit, charging means connected to said first switching element and to said second circuit, said second circuit including means for providing charging current to said charging means to charge said charging means to either a high or a low voltage, said first circuit including a first inverter having an input coupled to said buffer input and including said first switching element, and a second inverter having an input connected to the output of said first inverter and an output connected to said buffer output.

15. The buffer of claim 14, in which said first inverter includes first and second transistors having their output paths connected in series and their gates connected to said input, said switching element having an output circuit connected between a supply voltage and the output circuits of said first and second transistors.

16. The buffer of claim 15, in which said current providing means includes a third transistor effective when conducting to charge said charging means to one of said voltages at a first slow rate, and a fourth transistor effective when conducting to charge said charging means to a second voltage at a second, faster rate.

17. The buffer of claim 16, in which said fourth transistor has a higher W/L ratio than that of said third transistor.

18. The buffer of claim 17, in which said third and fourth transistors each including an output circuit connected between a voltage source and a reference potential, an output node being established at the connection of said output circuits, said output node being connected to said charging means.

19. The buffer of claim 18, in which said second circuit includes a third inverter connected to said input, and a fourth inverter connected to the output of said third inverter and including said third and fourth transistors.

20. The buffer of claim 19, further comprising a fifth inverter in said second circuit having its input connected to said buffer output, and a fifth transistor having its gate connected to the output of said fifth inverter and an output terminal connected to said charging means and to the output node of said fourth inverter.

21. A buffer comprising an input and an output; a first, relatively high-speed circuit coupled between said input and said output and including a first switching element having a first switching voltage; and a second, relatively low-speed circuit coupled between said input and said output and to said first circuit, said second circuit including a second switching element having a second switching voltage lower than said first switching voltage and means for controlling the operation of said first switching element in said first circuit, said first circuit including a first inverter having an input coupled to said buffer input and having a first switching voltage, said second circuit including a second inverter also having an input coupled to said buffer input and having a second switching voltage lower than said first switching voltage.

22. The buffer of claim 21, in which said first and second inverters each includes a pair of complementary transistors, the W/L ratios of said transistors in said first inverter being greater than that in said second inverter.

23. The buffer of claim 21, in which said switching element is included in said first inverter.

24. The buffer of claim 23, further comprising charging means connected to said switching element and to said second circuit, said second circuit including means for providing charging current to said charging means to charge said charging means to either a high or a low voltage.

25. The buffer of claim 23, in which said first inverter includes first and second transistors having their output paths connected in series and their gates connected to said input, said switching element having an output circuit connected between a supply voltage and the output circuits of said first and second transistors.

26. The buffer of claim 25, in which said current providing means includes a third transistor effective when conducting to charge said charging means to one of said voltages at a first slow rate, and a fourth transistor effective when conducting to charge said charging means to a second voltage at a second, faster rate.

27. The buffer of claim 26, in which said fourth transistor has a higher W/L ratio than that of said third transistor.

28. The buffer of claim 27, in which the output circuits of said third and fourth transistors are connected between a voltage source and a reference potential, an output node being established at the connection of said output circuits, said output node being connected to said charging means.

29. The buffer of claim 28, in which said second circuit includes a third inverter connected to said input, and a fourth inverter connected to the output of said third inverter and including said third and fourth transistors.

30. The buffer of claim 29, further comprising a fifth inverter in said second circuit having its input connected to said buffer output, and a fifth transistor having its gate connected to the output of said fifth inverter and an output terminal connected to said charging means and to the output node of said fourth inverter.

* * * * *